(12) United States Patent
Ohtsuka (10) Patent No.: US 8,975,707 B2
(45) Date of Patent: Mar. 10, 2015

(54) SEMICONDUCTOR DEVICE

(75) Inventor: Masaya Ohtsuka, Kobe (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 14/004,583

(22) PCT Filed: Mar. 12, 2012

(86) PCT No.: PCT/JP2012/056795
§ 371 (c)(1),
(2), (4) Date: Sep. 11, 2013

(87) PCT Pub. No.: WO2012/124794
PCT Pub. Date: Sep. 20, 2012

(65) Prior Publication Data
US 2014/0002143 A1    Jan. 2, 2014

(30) Foreign Application Priority Data

Mar. 14, 2011    (JP) .................. 2011-056008

(51) Int. Cl.
*H01L 23/48*    (2006.01)
*H01L 29/72*    (2006.01)
*H01L 29/739*    (2006.01)
*H01L 29/10*    (2006.01)
*H01L 29/78*    (2006.01)
(Continued)

(52) U.S. Cl.
CPC ........ *H01L 29/7395* (2013.01); *H01L 29/1087* (2013.01); *H01L 29/78* (2013.01); *H01L 29/7835* (2013.01); *H01L 29/0692* (2013.01); *G05F 1/575* (2013.01)
USPC ........... 257/371; 257/374; 257/392; 257/500; 257/E27.062; 257/E27.065; 257/E27.067; 257/E29.256; 438/152; 438/153; 438/200; 438/289

(58) Field of Classification Search
USPC .................. 257/371, 374, 392, 500, E27.062, 257/E27.065, E27.067, E29.256; 438/152, 438/153, 200, 289
See application file for complete search history.

(56) References Cited

U.S. PATENT DOCUMENTS

| | | | |
|---|---|---|---|
| 5,753,944 A | 5/1998 | Sakaue | |
| 6,040,610 A * | 3/2000 | Noguchi et al. | ............... 257/392 |
| 6,067,062 A | 5/2000 | Takasu et al. | |

(Continued)

FOREIGN PATENT DOCUMENTS

| | | |
|---|---|---|
| JP | 3-296275 | 12/1991 |
| JP | 5-326547 | 12/1993 |

(Continued)

OTHER PUBLICATIONS

International Search Report issued on May 15, 2012 in PCT/JP2012/056795 filed on Mar. 12, 2012.

(Continued)

*Primary Examiner* — Dao H Nguyen
(74) *Attorney, Agent, or Firm* — Cooper & Dunham LLP (57) ABSTRACT

A region for substrate potential is formed of an n-type well at a position in the direction of a channel length relative to the gate electrode and the position is between drain regions in the direction of a channel width. An n-type of a contact region with a higher concentration of n-type impurity than that of the region is provided in the region. The contact region is arranged away from the drain regions with a distance to obtain a desired breakdown voltage of PN-junction between the region and the drain region.

8 Claims, 10 Drawing Sheets

(51) Int. Cl.
*H01L 29/06* (2006.01)
*G05F 1/575* (2006.01)

(56) References Cited

U.S. PATENT DOCUMENTS

| | | | |
|---|---|---|---|
| 7,755,147 B2 * | 7/2010 | Satoh | 257/371 |
| 2002/0145173 A1 * | 10/2002 | Carpenter et al. | 257/500 |
| 2004/0014268 A1 * | 1/2004 | Ishibashi et al. | 438/200 |
| 2004/0188776 A1 | 9/2004 | Russ et al. | |
| 2005/0110056 A1 | 5/2005 | Sutardja | |
| 2007/0241402 A1 | 10/2007 | Hirano | |
| 2010/0314686 A1 | 12/2010 | Hirano | |

FOREIGN PATENT DOCUMENTS

| | | |
|---|---|---|
| JP | 6-275802 | 9/1994 |
| JP | 8-288401 | 11/1996 |
| JP | 9-23006 | 1/1997 |
| JP | 2939563 | 6/1999 |
| JP | 2001-119019 | 4/2001 |
| JP | 2004-22555 | 1/2004 |
| JP | 2007-087718 | 11/2007 |
| JP | 2009-21464 | 1/2009 |
| KR | 10-2008-0025045 | 3/2008 |

OTHER PUBLICATIONS

Korean official action dated Aug. 27, 2014 in corresponding Korean patent application No. 10-2013-7025994.
European Search Report dated Jul. 11, 2014 in corresponding European patent application No. 12 75 8015.7.

* cited by examiner

SEMICONDUCTOR DEVICE

CROSS-REFERENCE TO RELATED APPLICATIONS

Priority is claimed on Japanese Patent Application No. 2011-056008, filed with the Japanese Patent Office on Mar. 14, 2011, the content of which is incorporated herein by reference.

BACKGROUND OF THE INVENTION

1. Field of the Invention

The present invention relates to semiconductor devices, more specifically to semiconductors with MOS transistors having; source and drain regions of the second conductivity type which are spaced at intervals from each other and formed on a semiconductor layer of the first conductivity type; a channel region of the first conductivity type which is formed between the source and drain regions; and a gate electrode formed on the channel region with a gate insulator film in between the gate electrode and the channel region.

2. Description of Related Art

Transistors which are termed "driver transistors" are known as MOS transistors. In MOS transistors, transistors with a large channel width (W) and a large output current are generally termed "driver transistors".

Figure 8:
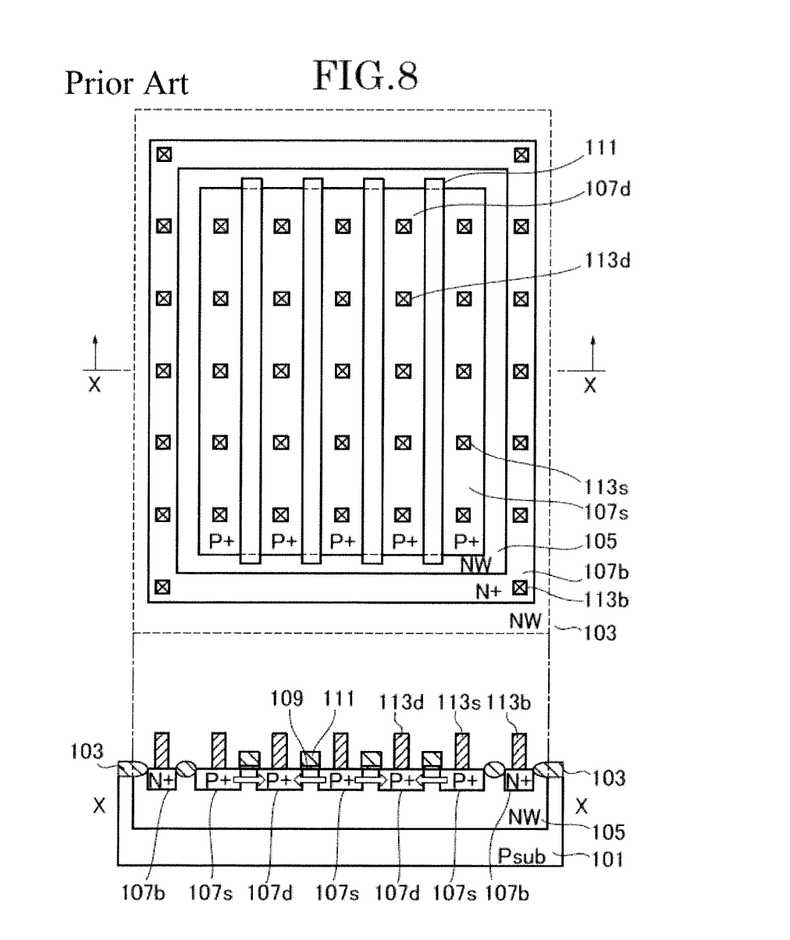

FIG. 8 shows a schematic plan view and a cross-sectional view illustrating the driver transistors according to the related art. The cross-sectional view is along the position X-X of the plan view.

A LOCOS (Local Oxidation of Silicon) oxide film 103 is formed in the surface of a p-type silicon substrate 101 in order to define a position for the driver transistor to be formed. An n-type well 105 is formed in the position of the p-type silicon substrate 101. A plurality of source regions 107s and drain regions 107d composed of p-type impurity-diffused layers are provided in the n-type well 105. The source region 107s and the drain region 107d are spaced from each other and arranged in alternate shifts.

A gate electrode 111 made of poly-silicon is formed on the n-type well 105 between the source region 107s and the drain region 107d with a gate insulator film 109 in between the gate electrode 111 and the n-type well 105. The gate electrode 111 is formed in a position between the source region 107s and the drain region 107d. FIG. 8 shows a transistor with four gate electrodes, but it is common for dozens of gate electrodes to be provided in order to design a large channel width.

A contact region for a substrate potential 107b (hereinafter "contact region for substrate potential" is referred to as "contact region") made of an n-type impurity-diffused layer is provided in the n-type well 105 in such a way as to enclose the positions where the source region 107s and drain region 107d are formed. The contact region 107b is one for obtaining the substrate potential, namely an electrical potential of the n-type well 105.

An interlayer dielectric film (not shown in the figures) is formed all over the silicon substrate 1 and contains a region where the source region 107s, the drain region 107d, the gate electrode 111 and the contact region 107b are formed. A contact 113s is formed on the source region 107s. A contact 113d is formed on the drain region 107d. A contact 113b is formed on the contact region 107b. A contact is formed on the gate electrode 111 in a region which is not shown in the figures. These contacts are made of a conducting material.

A plurality of the source regions 107s is electrically supplied and all set to be the same predetermined electric potential. A plurality of the drain regions 107d is electrically supplied and all set to be the same predetermined electric potential.

A plurality of the gate electrodes 111 is electrically supplied and all set to be the same predetermined electric potential. The contact region 107b is electrically supplied and set to be an electric potential that is the same as that of the source region 107s or the drain region 107d.

Or the contact region 107b is electrically supplied and set to be another electric potential different from that of the source region 107s and that of the drain region 107d.

As shown in FIG. 8, it is characteristic of the driver transistor that the source region 107s and the drain region 107d are arranged in alternate shifts on both sides of the gate electrodes 111.

Once the driver transistor has been "on" (a state capable of carrying an electric current), an electric current is carried in a direction of the arrow as shown in the cross-sectional view of FIG. 8.

In summary, one source region 107s and one drain region 107d act on the bilateral gate electrodes 111,111, so that it is possible to accomplish a layout that can carry a large current in a small area.

Here, a role of the contact region 107b will be described. The contact region 107b is arranged for providing a predetermined electric potential to the n-type well 105. In this related art, a case is explained of providing ground potential (electric potential at 0V) to the contact region 107b and the n-type well 105. If the ground potential is provided to the contact region 107b, all of the contact region 107b and the n-type well 105 should be the ground potential in theory. However, a phenomenon as explained below occurs in real driver transistors.

As explained previously, the driver transistors are sometimes designed with a remarkably large channel width, for example, over 100,000 micrometers due to a need to carry a large current.

In this case, not only the channel width (vertical direction in FIG. 8) but also the channel length (lateral direction in FIG. 8) is enlarged. As a result, a layout range of the driver transistor becomes very large.

If the layout range of the driver transistor is enlarged, it is known that the substrate potential becomes out of the ideal state at a position away from the contact region 107b due to an influence of the substrate potential by impact ionization, which mainly stems from a large resistance of the n-type well 105.

Figure 9:
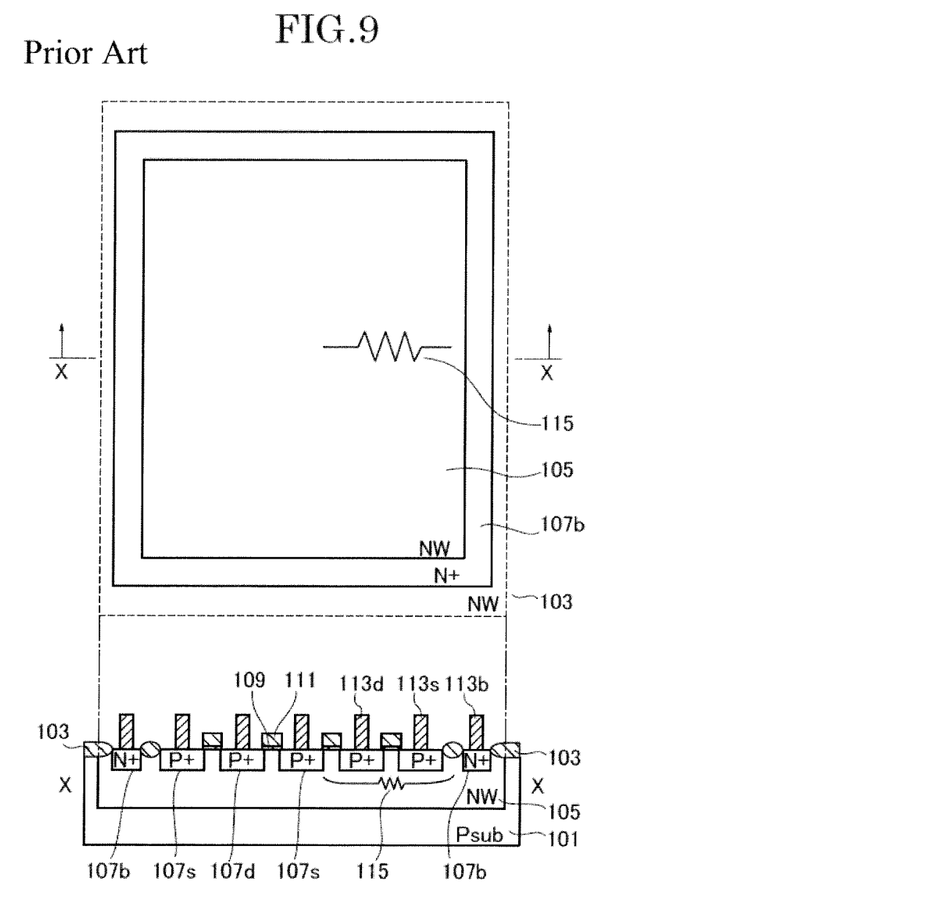
FIG. 9 is a figure illustrating a defect of the driver transistor according to the related art.

FIG. 9 shows a schematic plan view and a cross-sectional view for illustrating a problem in the driver transistors according to the related art. For convenience, only the contact region 107b at a position of the driver transistor to be formed is shown in the plan view.

As shown in FIG. 9, a substrate resistance 115 of the n-type well 105 is large due to the influence of the substrate potential by impact ionization, so that the substrate potential increases in a position away from the contact region 107b.

This phenomenon is most remarkable at a position farthest from the contact region 107b, namely, near the middle of the position where the driver transistor is formed.

If the substrate potential is increased due to an inadequate fixation of the substrate potential, an electrical potential at the source region 107s and the substrate potential become electrical potentials with a forward bias direction and a parasitic bipolar transistor inside of the driver transistor begins to act by a current flow, and as a result, a large current flows between the source and drain regions 107s, 107d at a time and the driver transistor causes thermal breakdown.

The thermal breakdown by the parasitic bipolar transistor is a fatal defect for transistors. In this case, there is not only a risk of a breakdown of the device, but also a risk of ignition from an IC (Integrated Circuit) and smoke generation causing a serious accident. Therefore, it is necessary to handle the parasitic bipolar transistor with care.

Several methods to prevent the action of the parasitic bipolar transistor are known. As one of the methods to handle without modifying the transistor structure, a countermeasure by a circuit layout will be explained below.

Figure 10:
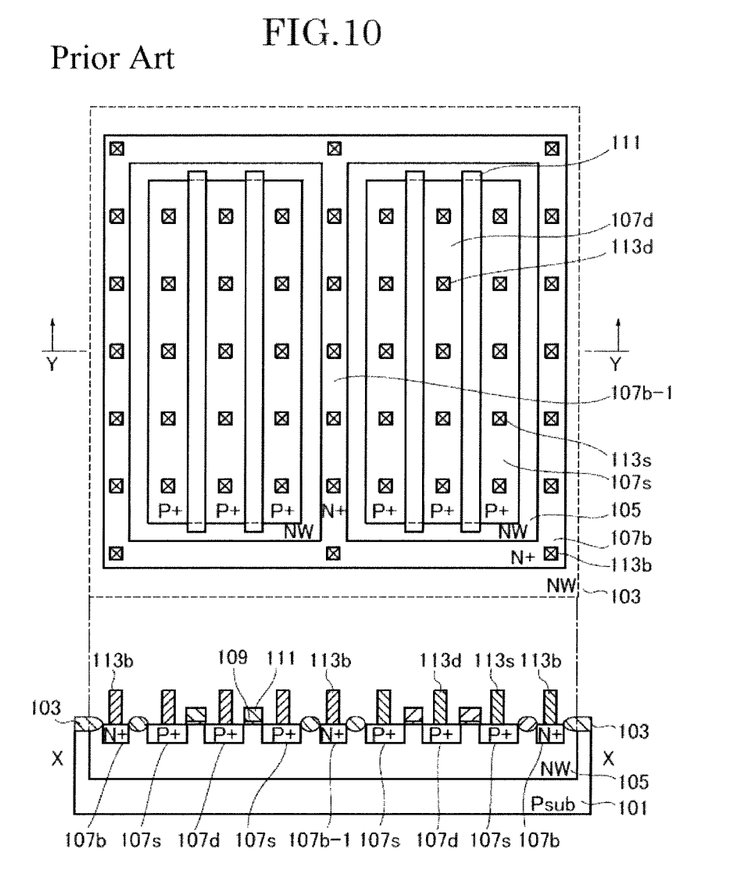

FIG. 10 shows a schematic plan view and a cross-sectional view for illustrating another example of the driver transistors according to the related art. The cross-sectional view is along the positions signed by Y, Y in the plan view. This will be explained by referring to FIG. 10 as a method to provide a contact region also inside of the driver transistor (for example see Patent Literature 1: JPA H06-275802).

As shown in FIG. 10, the source region 107s at the middle of where the driver transistor is formed is divided into, for example, two regions. A contact region 107b-1 is added to a region in between the two regions. Herewith, an increase in the substrate potential is prevented also in the middle of where the driver transistor is formed, away from around the edge. As a result, the parasitic bipolar transistor hardly acts.

Figure 11:
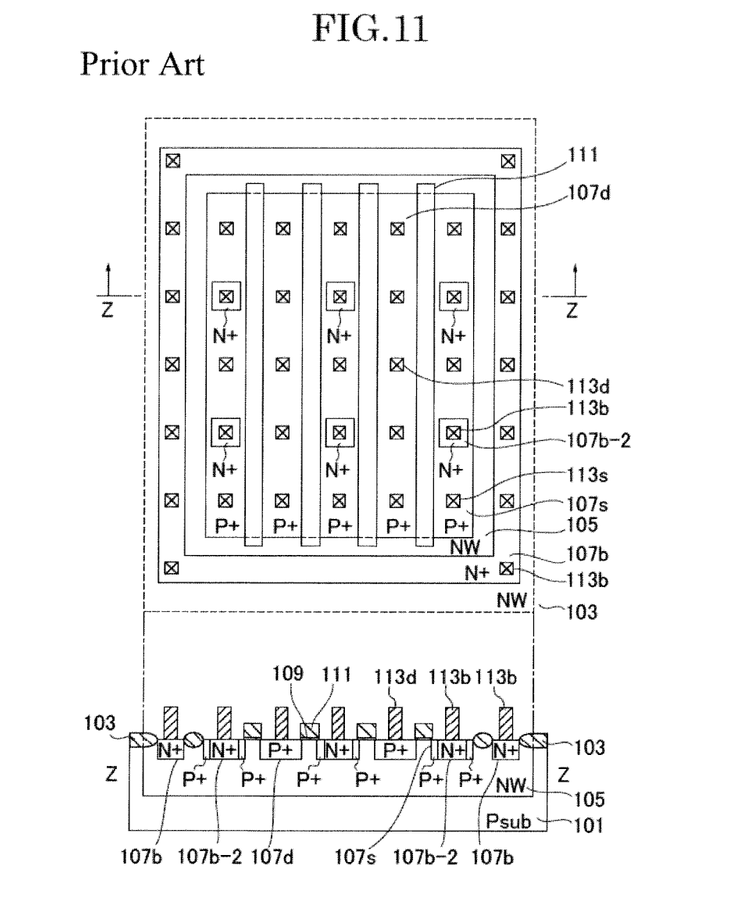

FIG. 11 shows a schematic plan view and a cross-sectional view for illustrating yet another example of the driver transistors according to the related art. The cross-sectional view is along the positions signed by Z, Z in the plan view. Another method to prevent the action of the parasitic bipolar transistor will be explained below by referring to FIG. 11 as a method to provide a contact region also inside of the source region (for example, see Patent Literature 2: JPA H08-288401).

As shown FIG. 11, a contact region 107b-2 is formed on a part of the source region 107s. A difference with the related art shown in FIG. 10 is that the original source region 107s (a p-type diffuse layer region) abuts on the contact region 107b-2 (an n-type diffuse layer region). In this way, a source whose n-type and p-type diffuse layer regions are formed by abutting each other in the same region is termed "Butting Source".

The contact region 107b-2 is electrically connected via the contact 113b to a metal wired layer (not shown in the figures) which is electrically connected by the source region 107s and the contact 113s. In summary, the source region 107s and the contact regions 107b, 107b-2 are all set to be the same electrical potential.

The contact 113b is formed on the contact region 107b-2. Moreover, the contact 113b is sometimes formed to cross from above the contact region 107b-2 to above the source region 107s (for example, see Patent Literature 3: JPA 2009-21464, Patent Literature 4: JPA H09-23006 and Patent Literature 5: JPB 2939563).

However, in the related art shown in FIG. 10, the contact region 107b-1 is added to the inside of where the driver transistor is formed, so that there is a problem of increasing the layout area, which means the driver transistor originally occupying a large amount of the layout area requires more of the layout area, which results in an increase in the chip area and the chip price.

In the related art as shown in FIG. 11, the source region 107s composed of the p-type impurity-diffused layer abuts on the contact region 107b-2 composed of the n-type impurity-diffused layer, so that a breakdown voltage of the PN junction is low at this part. Therefore, there is a problem of not being able to set the source region 107s and the contact region 107b-2 at different electrical potentials.

Here, a case was explained in which the contact region 107b-2 is arranged in the source region 107s, but there is the same problem in a case that the contact region 107b-2 is arranged in the drain region 107d.

SUMMARY OF THE INVENTION

An object of the present invention is to provide a semiconductor device which is able to set its substrate potential in a MOS transistor different from electrical potentials of source and drain regions, and to prevent a partial increase in the substrate potential (this partial increase generates a phenomenon in which the substrate potential is increased at a part of the substrate).

A semiconductor device according to the present invention has a MOS transistor, having, a source region of a second conductivity type and a drain region of the second conductivity type spaced from each other and formed on a semiconductor layer of a first conductivity type; a channel region of the first conductivity type formed in a position of the semiconductor layer between the source region and the drain region; and a gate electrode, being formed on the channel region with a gate insulator film in between the gate electrode and the channel region; a region for substrate potential of the first conductivity type, being formed in another position of the semiconductor layer relative to the gate electrode in a direction of the channel length, this position being between the source regions or the drain regions in the direction of the channel width; and a contact region for substrate potential of the first conductivity type, being formed in the region for substrate potential in a concentration of impurity of the first conductivity type higher than that of the region for substrate potential, wherein the contact region is arranged in the region for substrate potential away from the source region or the drain region with a distance to obtain a desired breakdown voltage of PN junction between the region for substrate potential and the source region or the drain region.

Here, the term first conductivity type means p-type or n-type, and the term second conductivity type means n-type or p-type opposite to the first conductivity type.

A semiconductor layer under the gate electrode located in the direction of the channel width relative to the region-fsp is also defined as a channel region.

Here, "region-fsp" is "a region of the first conductivity type, which is formed as being surrounded by a source region or a drain region of the second conductivity type, and is for detecting and/or setting the substrate potential".

In semiconductors according to the present invention, a PN junction is formed by a region-fsp of the first conductivity type and a source region or a drain region of the second conductivity type.

The contact region, which is touched by a contact composed of a conducting material, is arranged in the region-fsp at a distance away from the source and drain regions. It is required for the contact region to have over a certain impurity concentration in order to reduce a contact resistance between the contact region and the contact.

In contrast, it is not necessary for the contact to touch the region-fsp. Therefore, it is acceptable that the impurity concentration of the first conductivity type in the region-fsp be at a level sufficient enough to obtain a desired breakdown voltage of PN junction, relative to the impurity concentration of the second conductivity type in the source region or the drain region.

As one example of semiconductor devices according to the present invention, the following is given. A semiconductor device, having: an output driver, controlling an input voltage;

a resistance circuit as a voltage divider for supplying a decomposition voltage by dividing an output voltage; a reference voltage-generation circuit for supplying a reference voltage; and, a constant voltage-generation circuit, having a comparison circuit for comparing the decomposition voltage from the resistance circuit to the reference voltage from the reference voltage-generation circuit, and controlling actions of the output driver in accordance with the comparison result, wherein the output driver is composed of a driver transistor of a MOS transistor of the semiconductor device according to the present invention.

BRIEF DESCRIPTION OF THE DRAWINGS

FIG. 8 is a schematic view illustrating a driver transistor according to the related art. FIG. 8 shows a plan view and a cross-sectional view along the positions signed by X, X.

FIG. 10 is a figure showing another example of the driver transistor according to the related art. FIG. 10 shows a plan view and a cross-sectional view along the positions signed by Y, Y.

FIG. 11 is a figure showing another example of the driver transistor according to the related art. FIG. 11 shows a plan view and a cross-sectional view along the positions signed by Z, Z.

DETAILED DESCRIPTION OF THE PREFERRED EMBODIMENTS

Embodiment 1

Figure 1:
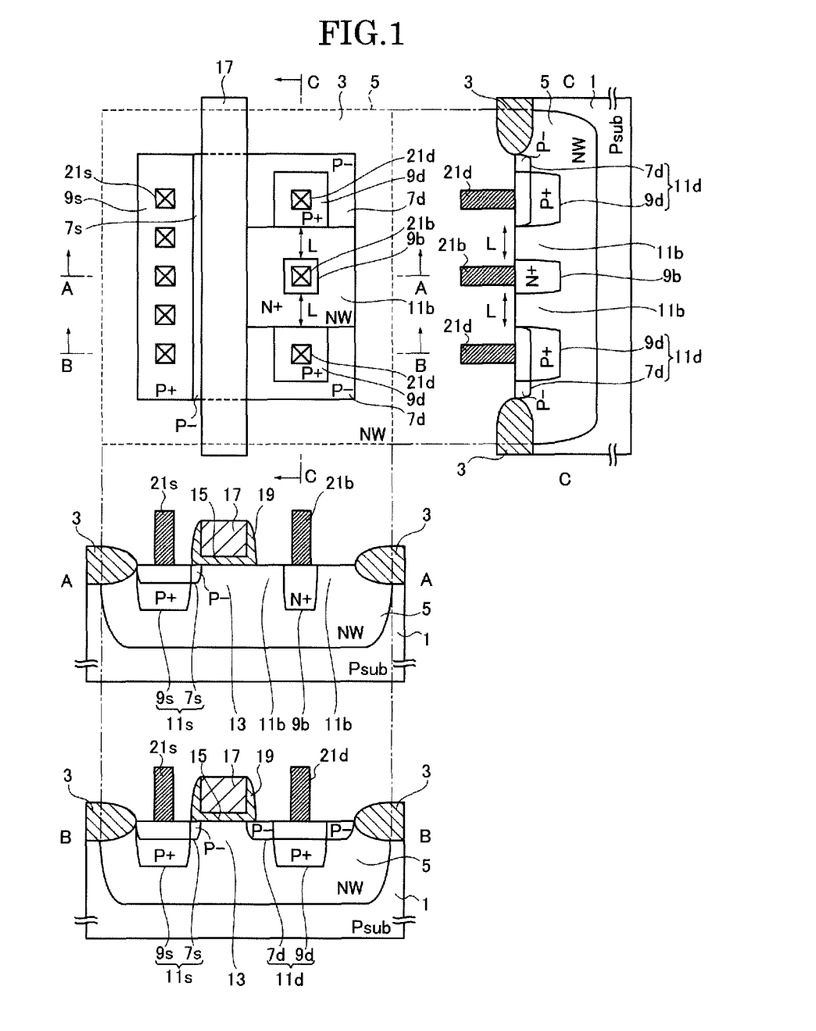
FIG. 1 shows a schematic plan view and cross-sectional views illustrating Embodiment 1.

FIG. 1 shows a schematic plan view and cross-sectional views illustrating one Embodiment. The three cross-sectional views are from cross-sectional surfaces along the position signed A-A, B-B and C-C in the plan view.

A LOCOS oxide film 3 is provided on a surface of a p-type (the second conductivity type) silicon substrate (Psub) in order to delimitate an area where a driver transistor is formed. An n-type well (a semiconductor layer of the first conductivity type: NW) 5 is provided on the area of the p-type silicon substrate 1.

A source region 11s composed of a p-type low concentration impurity-diffused layer (P−) 7s and a p-type high concentration impurity-diffused layer (P+) 9s is provided in the n-type well 5.

A drain region 11d composed of a p-type low concentration impurity-diffused layer (P−) 7d and a p-type high concentration impurity-diffused layer (P+) 9d is provided in the n-type well 5.

In this Embodiment, the drain region 11d has been divided into two regions. A part of the n-type well 5 between the drain regions 11d, 11d consists of a region-fsp 11b.

An n-type of contact region (N+) 9b having a higher concentration of an n-type impurity than that of the region-fsp 11b is provided in the region-fsp 11b.

The contact region 9b is arranged away from the drain region 11d with a distance L to obtain a desired breakdown voltage of PN-junction between the region-fsp 11b and the drain region 11d. The distance L is preferably over 0.1 micrometers.

For example, the distance L is over 0.5 micrometers in a case of setting 10V (V: volt) as the breakdown voltage of PN junction between the region-fsp 11b and the drain region 11d.

The source regions 11s are arranged away from the drain region 11d, the region-fsp 11b and the drain region 11d on the side of an array of the drain region 11d, the region-fsp 11b and the drain region 11d.

A channel region 13 is composed of parts of n-type well 5 between the drain region 11d and the source region 11s, between the region-fsp 11b and the source region 11s, between the drain region 11d and the source region 11s.

A gate electrode 17 made of, for example, poly-silicon is formed on the channel region 13 with a gate insulator film 15 in between the gate electrode 17 and the channel region 13.

A sidewall insulator film 19 (not shown in the plan view) is formed on the lateral surfaces of the gate electrode 17. The sidewall insulator film 19 is used advantageously to form a source region 11s of a LDD (lightly doped drain) structure and a drain region 11d of a double diffusion structure.

Explaining the arrangement position of the region-fsp 11b based on the positions of the channel region 13 and the gate electrode 17, the region-fsp 11b is arranged at a position in the direction of the channel length relative to the gate electrode 17 between the drain regions 11d, 11d in the direction of the channel width. The region-fsp 11b on the surface of the n-type well 5 abuts on the gate electrode 17 in the top view.

An interlayer dielectric film (not shown in the figures) is formed all over the silicon substrate 1 in a condition of including the positions where the source region 11s, the drain region 11d, the gate electrode 17 and the region-fsp 11b are formed.

A contact 21s is formed on the p-type high concentration impurity-diffused layer 9s of the source region 11s. A contact 21d is formed on the p-type high concentration impurity-diffused layer 9d in the drain region 11d.

A contact 21b is formed on the contact region 9b. A contact is formed on the gate electrode 17 in a region not shown in the figures. These contacts are made of a conducting material.

The two drain regions 11d, 11d are electrically supplied with a predetermined electrical potential. The source region 11s is electrically supplied with a predetermined electrical potential. The gate electrode 17 is electrically supplied with a predetermined electrical potential.

The region-fsp 11b and the channel region 13 are electrically supplied with electrical potentials equal to the source region 11s or the drain region 11d, or different from the source region 11s and the drain region 11d.

In this Embodiment, the contact region 9b is provided on the region-fsp 11b away from the drain region 11d with a distance L to obtain a desired breakdown voltage of PN junction between the region-fsp 11b and the drain region 11d.

Therefore, it is possible to set the substrate potential in MOS transistor different from an electrical potential of the source region 11s. It is also possible to set the substrate potential in the MOS transistor different from an electrical potential of the drain region 11d.

In addition to it, in this Embodiment, the region-fsp 11b for measuring and/or setting the substrate potential and the contact region 9b are arranged at a position in the direction of channel length relative to the gate electrode 17 between the drain regions 11d, 11d in the direction of the channel width.

Namely, the region-fsp 11b and the contact region 9b are arranged at a vicinity of the gate electrode 17, so that it is possible to reduce a distance between the contact region 9b and the channel region 13, and prevent a partial increase in the substrate potential of MOS transistor.

In this Embodiment, the channel region 13 positioned in the direction of the channel length relative to the region-fsp 11b does not seem to have a function as a channel. But, in fact, a decreased amount of a current drivability of the transistor is less than that equivalent to the channel width of the region-fsp 11b (decreased amount of the channel width). Therefore, it is believed that a part of the channel region 13 positioned in the direction of the channel length relative to the region-fsp has a function as a channel.

Embodiment 2

Figure 2:
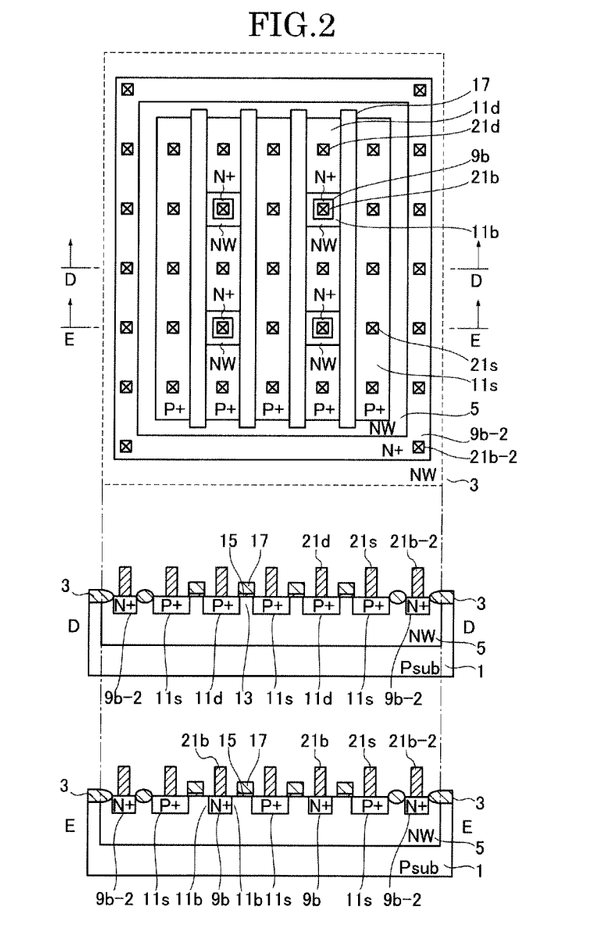
FIG. 2 shows a schematic plan view and a cross-sectional views illustrating Embodiment 2.

FIG. 2 shows a schematic plan view and cross-sectional views for illustrating Embodiment 2. The two cross-sectional views are along the positions signed by D-D and E-E in the schematic plan view, respectively. Members, sections and so on in FIG. 2 with the same function as those in FIG. 1 are assigned the same numerals and letters, and the description thereof is omitted.

Embodiment 2 has a plurality of source regions 11s and a plurality of drain regions 11d. The source region 11s and drain regions 11d are spaced from each other and arranged in alternate shifts.

The source region 11s and the drain region 11d are composed of only a p-type high concentration impurity-diffused layer (P+). A gate electrode 17 is provided between the source regions 11s, 11s. A gate electrode 17 is provided between drain regions 11d, 11d.

FIG. 2 shows the Embodiment with only four gate electrodes 17, but it is common for dozens of the gate electrodes 17 to be used. Due to designing a large channel width, the source regions 11s and the drain regions 11d are provided in accordance with the number of the gate electrodes.

In this Embodiment, the drain region 11d is divided into three for a single source region. A region-fsp is composed of the n-type well 5 at a position between the drain regions 11d in the direction of the channel width.

The same as in Embodiment 1 explained by referring to FIG. 1, a contact region 9b is provided in the region-fsp 11b.

The contact region 9b is arranged away from the drain region 11d with a distance to obtain a desired breakdown voltage of PN-junction between the region-fsp 11b and the drain region 11d.

The second contact region 9b-2 composed of the n-type impurity-diffused layer is provided in the n-type well 5 in a condition of surrounding the source and drain regions 11s, 11d.

The second contact region 9b-2 is also for leading out the substrate potential, namely an electric potential of the n-type well 5 the same as the region-fsp 11b and the contact region 9b.

A contact 21s is formed on the source region 11s. A contact 21d is formed on the drain region 11d. A contact 21b is formed on the contact region 9b.

A contact 21b-2 is formed on the second contact region 9b-2. A contact is formed on the gate electrode 17 in an area not shown in the figures. These contacts are made of a conducting material.

A plurality of the source regions 11s is electrically supplied with the same predetermined electrical potential. A plurality of the drain regions 11d is electrically supplied with the same predetermined electrical potential. A plurality of the gate electrodes 17 is electrically supplied with the same predetermined electrical potential.

The contact region 9b and the second contact region 9b-2 are electrically supplied with electrical potentials equal to the source region 11s and/or the drain region 11d, or different from the source region 11s and/or the drain region 11d, respectively.

In this Embodiment, the same as in Embodiment 1 explained by referring to FIG. 1, it is possible to set the substrate potential in the MOS transistor different from the source region 11s and/or the drain region 11d.

In addition, in this Embodiment, the region-fsp 11b for measuring and/or setting the substrate potential and the contact region 9b are arranged in an area where the driver transistor is formed, so that it is possible to reduce a distance between the contact region 9b and the channel region 13, and prevent a partial increase in the substrate potential of MOS transistor.

Figure 3:
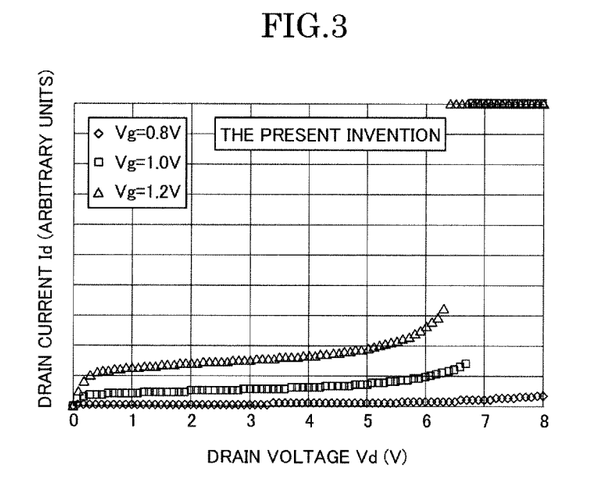
FIG. 3 shows a Vd-Id characteristic of Embodiment 2 in FIG. 2.
Figure 4:
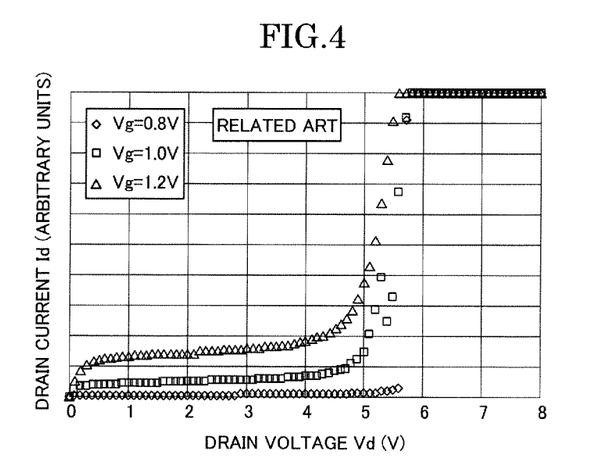
FIG. 4 shows a Vd-Id characteristic of the related art in FIG. 9.

FIG. 3 shows a Vd-Id characteristic of the Embodiment 2 in FIG. 2. FIG. 4 shows a Vd-Id characteristic of the related art in FIG. 8. In FIGS. 3 and 4, the vertical axis represents drain current Id (arbitrary units), and the horizontal axis represents drain voltage Vd (unit: V).

In the Embodiment in FIG. 2 and the related art in FIG. 4, a driver transistor with the channel width of 1000 micrometers is used. As to the Embodiment in FIG. 2, the regions-fsp 11b with the dimension of 2 micrometers in the channel width direction are provided at 20 points.

Structures of the Embodiment in FIG. 2 and the related art in FIG. 8 are identical to each other except that the region-fsp 11b and the contact region 9b are provided in Embodiment 2 shown in FIG. 2. As the gate voltage Vg, 0.8V, 1.0V or 1.2V is applied, an electrical potential of the source regions 11s and the substrate potential are all set to ground potential.

As shown in FIG. 3, the structure of the Embodiment in FIG. 2 is able to withstand the drain voltage Vd of more than 6V. In contrast, as shown in FIG. 4, the structure of the related art in FIG. 9 causes the transistor to breakdown by the drain voltage Vd of less than 6V.

In this way, the semiconductor device according to the present invention, the region-fsp 11b and the contact region 9b are arranged in a range where the driver transistor is formed, so that it is possible to improve the breakdown voltage of the driver transistor.

Embodiment 3

Figure 5:
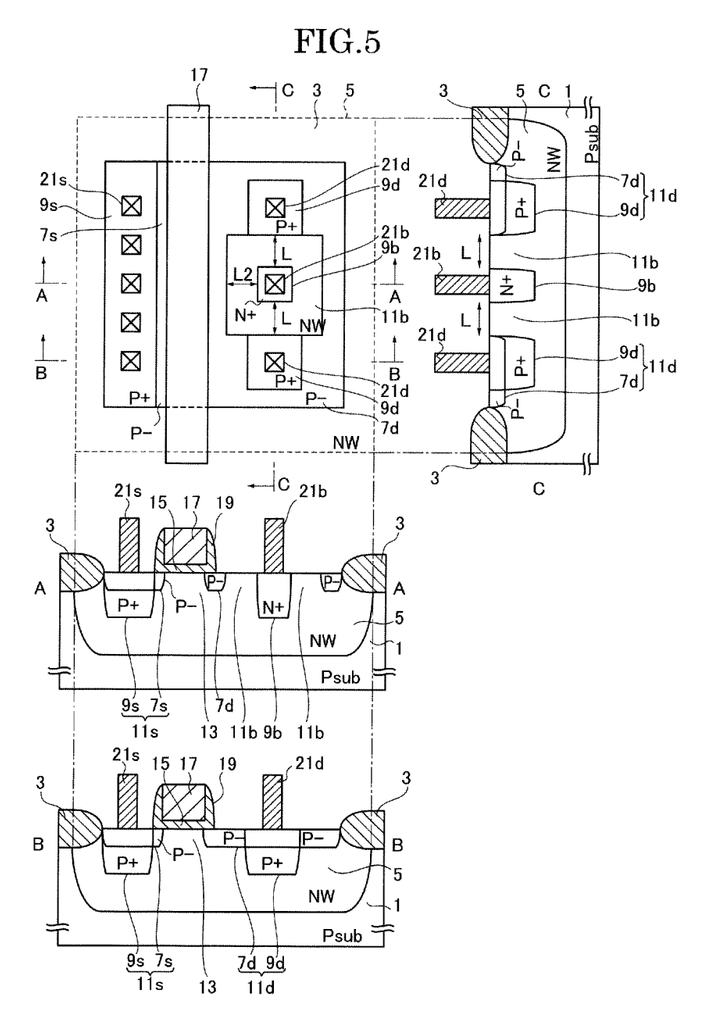
FIG. 5 shows a schematic plan view and cross-sectional views illustrating Embodiment 3.

FIG. 5 shows a schematic plan view and cross-sectional views for illustrating yet another Embodiment. Members, sections and so on with the same function as those in FIG. 1 are assigned the same numerals and letters, and the description thereof is omitted.

In this Embodiment, a region-fsp 11b on a surface of an n-type well 5 is arranged away from a gate electrode 17 in top view.

A portion of a p-type low concentration impurity-diffused layer 7d of a drain region 11d is arranged between the region-fsp 11b and the gate electrode 17.

A contact region 9b is arranged in the direction of the channel length away from the p-type low concentration impurity-diffused layer 7d with a distance L2 to obtain a desired breakdown voltage of PN-junction between the region-fsp 11b and the drain region 11d.

It is acceptable that the distance L2 be smaller than a distance L along the channel width direction that the region-fsp 11b abuts on a p-type high concentration impurity-diffused layer 9d.

According to this Embodiment, it is possible to prevent a decrease in the current drivability of the MOS transistor which is caused by the drain regions 11d not existing between the region-fsp 11b and the gate electrode 17 on a surface of the n-type well 5.

In this Embodiment, the p-type low concentration impurity-diffused layer 7d is also provided in a position on the opposite side to the gate electrode 17 in relation to the contact region 9b, but it is acceptable that the p-type low concentration impurity-diffused layer 7d not be provided in this position.

It is also possible to apply it to the driver transistor shown in FIG. 2 in which the structure of a portion of the drain region 11d is arranged between the region-fsp 11b and the gate electrode 17.

Embodiment 4

Figure 6:
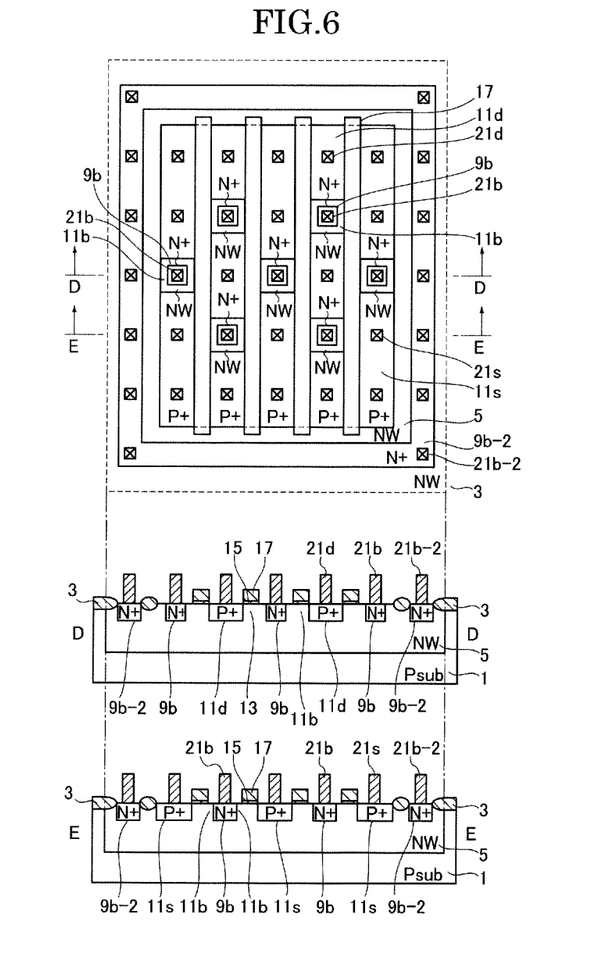
FIG. 6 shows a schematic plan view and cross-sectional views illustrating Embodiment 4.

FIG. 6 shows a schematic plan view and cross-sectional views illustrating yet another Embodiment. Members, sections and so on with the same function as those in FIG. 2 are assigned the same numerals and letters, and the description thereof is omitted.

In this Embodiment, comparing to the Embodiment in FIG. 2, a region-fsp 11b and a contact region 9b are also provided in a position between the source regions 11s, 11s in the direction of the channel width.

In this way, it is acceptable that the region-fsp 11b be provided in a position between the source regions 11s, 11s in the direction of the channel width and/or between the drain regions 11d, 11d in the direction of the channel length. It is acceptable that the contact region 9b be provided in a position between the source regions 11s, 11s in the direction of the channel width and/or between the drain regions 11d, 11d in the direction of the channel length.

In the Embodiments in FIGS. 2 and 6, a set of the region-fsp 11b and the contact region 9b is provided in all the drain regions 11d. In the Embodiment shown in FIG. 6, a set of the region-fsp 11b and the contact region 9b is provided in all the source regions 11s. In semiconductor devices according to the present invention, it is optional to provide a set(s) of the region-fsp 11b and the contact region 9b in the drain region(s) and/or source region(s). For example, it is acceptable to provide a set(s) of the region-fsp 11b and the contact region 9b in selected one or more of the drain region(s) 11d and/or the source region(s) 11s in the driver transistor.

In addition, it is also optional to provide any number of the set of the region-fsp 11b and the contact region 9b in one drain region 11d or one source region 11s of a driver transistor or a MOS transistor having a set of the source and drain regions 11d, 11s.

In addition, in the Embodiment shown in FIG. 6, the region-fsp 11b provided in the source region 11s and the region-fsp 11b provided in the drain region 11d are arrayed in a zigzag alignment.

It is acceptable for these regions-fsp 11b, 11b to be arranged in such a way that these regions-fsp 11b, 11b are positioned to overlap each other partially or totally in the direction of the channel length.

In addition, if providing the set of the region-fsp 11b and contact region 9d to multiple locations of a transistor, it is acceptable for the dimensions of the region-fsp 11b and contact region 9d and its impurity concentration to be varied.

In the Embodiment shown in FIG. 6, the second contact region 9b-2 is provided to surround a position where the transistor is formed. However, it is optional whether the second contact region 9b-2 surrounds a position where the transistor is formed.

In the Embodiments explained above, the gate electrode 17 made of poly-silicon is provided, but any conducting materials can be used for the gate electrode 17, and it is not limited to poly-silicon.

In the Embodiments explained above, a p-channel MOS transistor is provided; however, it possible to apply the structure of the p-channel MOS transistor of the semiconductor device according to the present invention to an n-channel MOS transistor, for example, in a case of setting the conductivity types of the members in the above Embodiments to be the opposite conductivity types, respectively.

In addition, the structure of the MOS transistor is not limited to the Embodiments above.

The present invention is applicable to any structure of MOS transistors having: source and drain regions of the second conductivity type which are spaced from each other and formed on a semiconductor layer of the first conductivity type; a channel region of the first conductivity type which is formed between the source and drain regions on the semiconductor layer; and a gate electrode formed on the channel region with a gate insulator film in between the gate electrode and the channel region.

Figure 7:
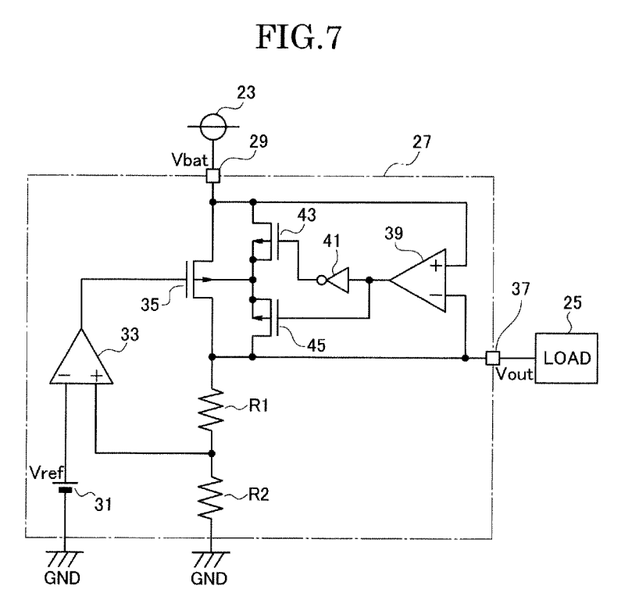
FIG. 7 is a circuit diagram illustrating one Embodiment of a semiconductor device having a constant voltage-generation circuit as an analogue circuit.

FIG. 7 is a circuit diagram illustrating one Embodiment of a semiconductor device having a LDO (Low Drop Out) regulator as a constant voltage-generation circuit of an analog circuit.

A constant voltage-generation circuit 27 is provided to constantly supply electrical power from a DC supply 23 to a load (object to consume electrical power) 25.

The constant voltage-generation circuit 27 has: an input terminal (Vbat) 29 connected by the DC supply 23; a reference voltage-generation circuit 31; a comparison circuit 33; an output driver 35 composed of a p-channel MOS transistor; divided resistance elements R1, R2; and an output terminal (Vout) 37.

The constant voltage-generation circuit 27 has a backflow prevention function to prevent a backflow of an electrical current from the output terminal 37 to the input terminal 29. This backflow prevention function is accomplished by a comparison circuit 39, an inverter 41, and p-channel MOS transistors 43, 45.

A driver transistor according to the present invention is applied to the output driver 35. In this case, the contacts leading out the substrate potential of the output driver 35 are connected to the node between the transistors 43, 45.

As to the comparison circuit 33 of the constant voltage-generation circuit 27, an output terminal of the comparison circuit 33 is connected to a gate electrode of the output driver 35, a reference voltage (Vref) is applied from a reference voltage-generation circuit 31 to a inverting-input element (−), and a voltage derived from dividing the output voltage (Vout) by means of the divided resistance elements R1, R2 is applied to a non-inverting-input element (+). The comparison circuit 33 controls an output of the output driver 35 for the voltage derived by the resistance elements R1, R2 to be equal to the reference voltage (Vref).

The backflow prevention function of the constant voltage-generation circuit 27 will be explained below.

When a voltage of an input terminal 29 is higher than that of the output terminal 37, the comparison circuit 39 outputs "high level", and at this time, the transistor 43 turns on and transistor 45 turns off.

By this, the contacts leading out the substrate potential of the output driver 35 are connected to the input terminal 29 to let the substrate potential be equal to the source of the output driver 35.

For example, when the voltage at the output terminal 37 is higher than the voltage at the input terminal 29 due to the load 25, the comparison circuit 39 outputs "low level", and at this time, the transistor 43 turns off and transistor 45 turns on.

By this, the contacts leading out the substrate potential of the output driver 35 are connected to the output terminal 37 to let the substrate potential be equal to the drain of the output driver 35. In this way, it is possible to prevent the backflow of electrical current from the output terminal 37 to the input terminal 29.

If considering a case using a conventional output driver having the "Butting Source" instead of using the output driver 35 according to the present invention, when the voltage at the output terminal 37 is higher than the voltage at the input terminal 29, the contacts leading out the substrate potential are connected to the output terminal 37 by the backflow prevention function.

At this time, a reverse bias is applied to a PN-junction between an n-type high concentration impurity-diffused layer for measuring the substrate potential and a p-type high concentration impurity-diffused layer for measuring a source electrical potential.

In the "Butting Source", the n-type high concentration impurity-diffused layer abuts on the p-type high concentration impurity-diffused layer, so that a breakdown voltage of PN-junction is low and there is a problem of not being able to prevent the backflow of electrical current.

In contrast, as to the output driver 35 composed of the driver transistor according to the present invention, for example, even if the contact region is provided in the source region, since the contact region composed of the n-type high concentration impurity-diffused layer is arranged in the region-fsp away from the source region with a distance sufficient enough to obtain a desired breakdown voltage of PN-junction between the source region and the region-fsp composed of an n-type impurity-diffused layer with relatively low concentration of the impurity, it is possible to set a desired breakdown voltage of PN-junction between the contact region and the source region to prevent the backflow of electrical current.

In addition, since this Embodiment has the output driver 35 composed of the driver transistor according to the present invention, it is possible to prevent a partial increase in the substrate potential of the output driver 35 and improve the reliability of the constant voltage generating circuit 27.

In addition to this, it is also possible to set the substrate potential of the output driver 35 to an electrical potential different from that of the source region 11s and drain region 11d.

Although the Embodiments according to the present invention have been explained above, the present invention is not limited to the Embodiments. The geometry, materials, arrangement, number and so on of the members in the Embodiments are only just examples and various modifications within the scope of the invention described in claims are possible.

In the present invention, it is possible to make the semiconductor devices have the contact area being provided away from the drain region and the source region with the distances of at least 0.1 micrometers, respectively.

The distance directions are not only limited to the planar directions but also the depth of the semiconductor layer and so on, which includes all directions.

It is acceptable for the source region, the drain region and the contact region to be connected to electrical nodes with electrical potentials different to each other.

It is acceptable for the contact region to be connected to an electrical node with the same electrical potential as either the source region or the drain region.

In the semiconductor device according to the present invention, it is also acceptable that the contact region on a surface of the semiconductor layer abut on or away from the gate electrode in the top view. If the region-fsp is away from the gate electrode on the surface of the semiconductor layer, a portion of the drain region or the source region is arranged between the region-fsp and the gate electrode.

In addition, in the semiconductor device according to the present invention, it is acceptable that a set of the region-fsp and the contact region be arranged at positions in the direction of the channel length relative to the gate electrode, the position being between the source regions in the direction of the channel width and/or between the drain regions in the direction of the channel width.

In the semiconductor device according to the present invention, one example of the MOS transistors above is a driver transistor with a plurality of the drain region and the source region arranged in alternate shifts in the direction of the channel length. However, MOS transistors in semiconductor devices according to the present invention are not limited to driver transistors, but normal MOS transistors, for example, a MOS transistor with a set of source and drain regions and a gate electrode.

One example of semiconductor devices according to the present invention has: an output driver for controlling an input voltage; a resistance circuit as a voltage divider for supplying a decomposition voltage by dividing an output voltage; a reference voltage-generation circuit for supplying a reference voltage; and a constant voltage-generation circuit, having a comparison circuit for comparing the decomposition voltage from the resistance circuit to the reference voltage from the reference voltage-generation circuit and controlling the actions of the output driver in accordance with the comparison result; wherein the output driver is composed of a driver transistor of a MOS transistor according to the present invention.

However, semiconductor devices which are able to be applied to the present invention are not limited to the semiconductor devices above, and it is possible to apply the present invention to a semiconductor device if the semiconductor device just has a MOS transistor having a source region and a drain region of the second conductivity type which are spaced from each other and formed on a semiconductor layer of the first conductivity type; a channel region with the first conductivity type, being formed in a position of the semiconductor layer between the source and drain regions; and, a gate electrode, being formed on the channel region with a gate insulator film in between the gate electrode and the channel region.

In the semiconductor devices according to present invention, the contact region is arranged in the region-fsp away from the source region or the drain region with a distance to obtain a desired breakdown voltage of PN junction between the region-fsp and the source region or the drain region, so that it is possible for the semiconductor device according to the present invention to set the substrate potential different from those of the drain and source regions in MOS transistor.

In addition, in the semiconductor devices according to the present invention, a set of the region-fsp and the contact region for detecting and/or setting the substrate potential is arranged at a position in the direction of the channel length relative to the gate electrode between the source regions or the drain regions in the direction of the channel width, namely, a set of the region-fsp and the contact region is arranged at a vicinity of the gate electrode, so that it is possible for the semiconductor devices according to the present invention to shorten the distance between the contact region and channel region, to prevent a partial increase of the substrate potential, and to prevent a decrease in a bipolar breakdown voltage (snap back voltage) of the MOS transistor.

In the semiconductor devices according to the present invention, if the region-fsp on the semiconductor layer abuts on the gate electrode in the top view, there is not a source or a drain region between the contact region and the gate electrode at the surface of the semiconductor layer, so that, with respect to the channel length direction, there is no need to consider a distance between the contact region and the source or drain region at a position between the contact region and the gate electrode.

For example, if a drain or source region is provided between the contact region and the gate electrode at the surface of the semiconductor layer, it is advantageous for a case where there is a need to enlarge an entire width of the source region or drain region (a dimension in the direction of the channel length) in order to obtain a desired breakdown voltage of PN junction in the direction of the channel length.

In the semiconductor devices according to the present invention, there is a distance between the region-fsp on the semiconductor layer and the gate electrode in top view, and if a part of the source or drain region is arranged between the region-fsp and the gate electrode in top view, it is possible to prevent a decrease of the current drivability of MOS transistor due to there being no drain or source region between the region-fsp and the gate electrode at the surface of the semiconductor layer.

In the semiconductor devices according to the present invention, if a set of the region-fsp and the contact region is provided in both positions in the direction of the channel length relative to the gate electrode, one position is between the source regions in the direction of the channel width and the other position is between the drain regions in the direction of the channel width, the design possibility of the semiconductor device increases compared to a case that the a set of the region-fsp and the contact region is provided only in the source regions or drain regions.

In the semiconductor devices according to the present invention, if the MOS transistor is a driver transistor with the plurality of the drain region and the source region arranged in alternate shifts in the direction of the channel length, it is possible to prevent a partial increase in substrate potential even though the layout area for the driver transistor is large.

It is possible to apply the present invention to semiconductor devices equipped with a MOS transistor or driver transistor, for example, an integrated circuit for a power source.

The invention claimed is:

1. A semiconductor device, comprising:
a substrate including at least one region;
a semiconductor layer of a first conductivity type, disposed on the substrate;
a MOS transistor, having,
a source region of a second conductivity type and a drain region of the second conductivity type spaced from each other and formed on the semiconductor layer of the first conductivity type;
a channel region of the first conductivity type formed in a position of the semiconductor layer between the source region and the drain region; and
a gate electrode, being formed on the channel region with a gate insulator film in between the gate electrode and the channel region;
another region which is configured to have substrate potential of a first conductivity type and is disposed in another position of the semiconductor layer relative to the gate electrode in a direction of the channel length, said another position being between the gate electrode and the source region or drain region in the direction of the channel width; and
a contact region formed in said another region to have substrate potential in a concentration of impurity of the first conductivity type higher than that of said another region,
wherein the contact region is arranged in a vicinity of the gate electrode and in said another region away, with a non-zero distance, from the gate electrode as well as the source region or drain region, to obtain a desired breakdown voltage of PN junction between said another region and the source region or drain region.

2. The semiconductor device according to claim 1, wherein the non-zero distance is at least 0.1 micrometers.

3. The semiconductor device according to claim 1, wherein the source region, the drain region and the contact region for substrate potential are electrically supplied and set to electrical potentials different from each other.

4. The semiconductor device according to claim 1, wherein said another region at a surface of the semiconductor layer abuts on the gate electrode, in top view.

5. The semiconductor device according to claim 1, wherein there is a distance between said another region at a surface of the semiconductor layer and the gate electrode, and a part of the source region or a part of the drain region is arranged between the gate electrode and said another region, in top view.

6. The semiconductor device according to claim 1, wherein a set of said another region and the contact region are provided in both positions in the direction of the channel length, one position being between plural source regions in the direction of the channel width and the other position being between plural drain regions in the direction of the channel width.

7. The semiconductor device according to claim 1, wherein the MOS transistor is a driver transistor with a plurality of the drain region and the source region arranged in alternate shifts in the direction of the channel length.

8. A semiconductor device, comprising:
an output driver, controlling an input voltage;
a resistance circuit as a voltage divider for supplying a decomposition voltage by dividing an output voltage;
a reference voltage-generation circuit for supplying a reference voltage; and,
a constant voltage-generation circuit, having a comparison circuit for comparing the decomposition voltage from the resistance circuit to the reference voltage from the reference voltage-generation circuit, and controlling actions of the output driver in accordance with the comparison result,
wherein the output driver is composed of the driver transistor according to claim 7.

* * * * *